(12) United States Patent
Hsieh et al.

(10) Patent No.: US 9,006,863 B2
(45) Date of Patent: Apr. 14, 2015

(54) DIODE STRING VOLTAGE ADAPTER

(75) Inventors: Chung-Peng Hsieh, New Taipei (TW); Jaw-Juinn Horng, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 51 days.

(21) Appl. No.: 13/336,563

(22) Filed: Dec. 23, 2011

(65) Prior Publication Data

US 2013/0162331 A1    Jun. 27, 2013

(51) Int. Cl.
| | |
|---|---|
| H01L 29/66 | (2006.01) |
| H01L 23/62 | (2006.01) |
| H01L 27/092 | (2006.01) |
| H01L 21/70 | (2006.01) |
| H01L 27/02 | (2006.01) |
| H01L 29/93 | (2006.01) |
| H01L 29/06 | (2006.01) |
| H01L 27/08 | (2006.01) |
| H02H 9/00 | (2006.01) |
| H02H 3/20 | (2006.01) |
| H02H 9/04 | (2006.01) |

(52) U.S. Cl.
CPC .................................. H01L 27/0814 (2013.01)

(58) Field of Classification Search
USPC ......... 257/653, 654, 544–547, 355, 371, 109, 257/112, 122, 121, 162, 601, 656, 548, 910, 257/104; 361/91.5, 56
See application file for complete search history.

(56) References Cited

U.S. PATENT DOCUMENTS

| | | | |
|---|---|---|---|
| 6,940,104 B2 | 9/2005 | Yeh et al. | |
| 6,972,476 B2 | 12/2005 | Chen et al. | |
| 2004/0135141 A1* | 7/2004 | Pequignot et al. | 257/46 |
| 2006/0043489 A1* | 3/2006 | Chen et al. | 257/355 |
| 2008/0023767 A1* | 1/2008 | Voldman | 257/355 |
| 2010/0123985 A1* | 5/2010 | Wang et al. | 361/56 |

* cited by examiner

*Primary Examiner* — Mamadou Diallo
*Assistant Examiner* — Jay C Chang
(74) *Attorney, Agent, or Firm* — Lowe Hauptman & Ham LLP

(57) ABSTRACT

A diode string voltage adapter includes diodes formed in a substrate of a first conductive type. Each diode includes a deep well region of a second conductive type formed in the substrate. A first well region of the first conductive type formed on the deep well region. A first heavily doped region of the first conductive type formed on the first well region. A second heavily doped region of the second conductive type formed on the first well region. The diodes are serially coupled to each other. A first heavily doped region of a beginning diode is coupled to a first voltage. A second heavily doped region of each diode is coupled to a first heavily doped region of a next diode. A second heavily doped region of an ending diode provides a second voltage. The deep well region is configured to be electrically floated.

20 Claims, 2 Drawing Sheets

DIODE STRING VOLTAGE ADAPTER

TECHNICAL FIELD

The present disclosure relates generally to an integrated circuit and more particularly a diode string voltage adapter.

BACKGROUND

A diode comprises a PN junction formed by joining a block of P-type semiconductor with a block of N-type semiconductor. Multiple diodes are serially connected to form a diode string that facilitates integrated circuit (IC) device operation. The diode string provides a voltage drop in a circuit when the diode string is turned on in a forward bias condition, which can be used as a voltage adapter. With more advanced processes with smaller scales, there is a need for such a voltage adaptor to be operated with high supply voltage.

BRIEF DESCRIPTION OF THE DRAWINGS

Reference is now made to the following descriptions taken in conjunction with the accompanying drawings, in which.

DETAILED DESCRIPTION

Figure 1:
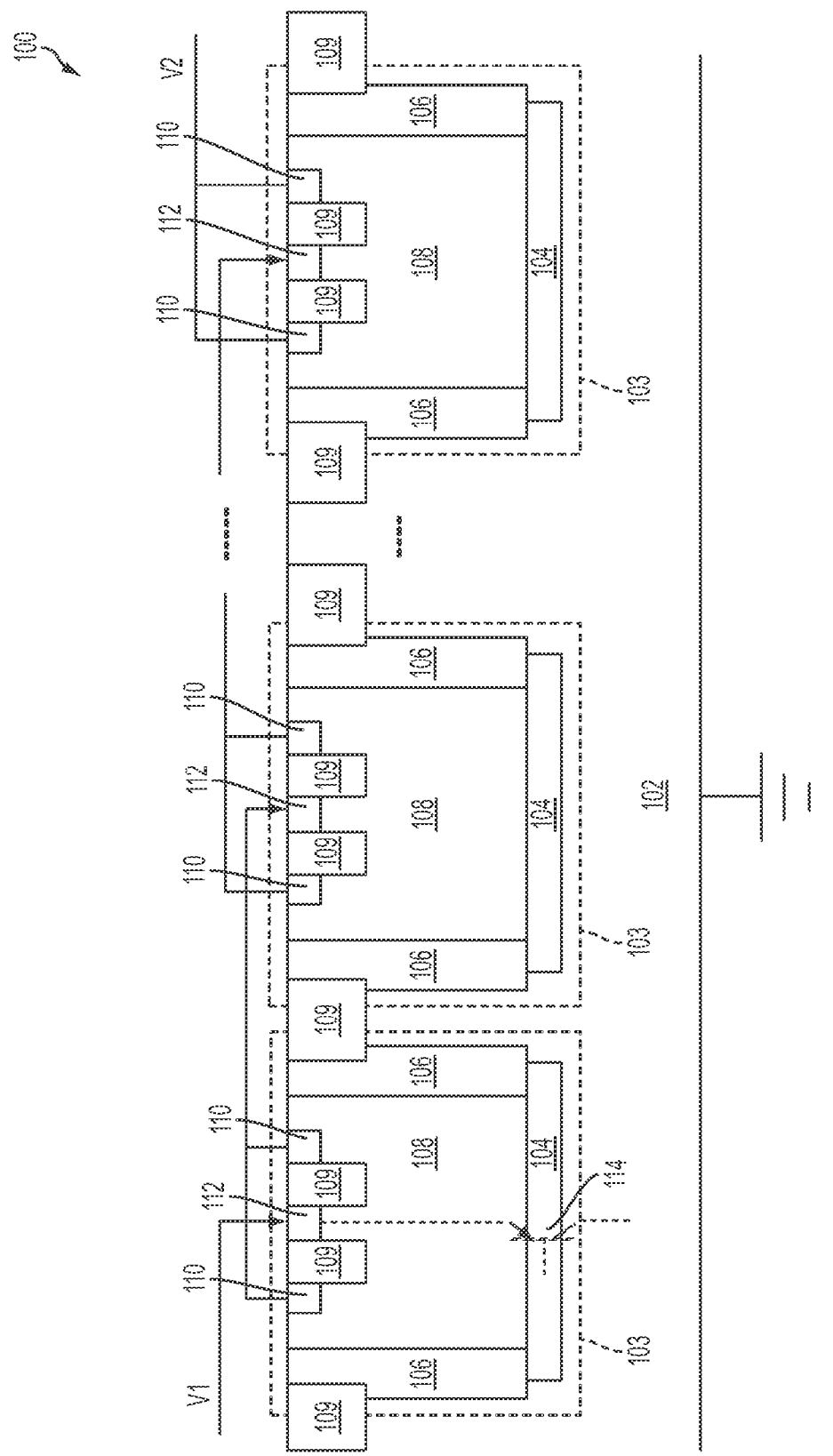
FIG. 1 is a schematic diagram of an exemplary diode string voltage adapter according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic diagram of an exemplary diode string voltage adapter 100 according to some embodiments. The diode string voltage adapter 100 includes a substrate 102 of a first conductive type and multiple diodes 103 formed in the substrate 102. Each diode 103 includes a deep well region 104 of a second conductive type formed in the substrate 102 and a first well region 108 of the first conductive type formed in the deep well region 104. A second well region 106 of the second conductive type is formed on the deep well region 104 and around the first well region 108 so as to isolate the first well region 108, and the second well region 106 is electrically floating (e.g., by not coupling to a voltage).

A first heavily doped region 112 of the first conductive type is formed on the first well region 108 and a second heavily doped region 110 of the second conductive type is formed on the first well region 108. Isolation structures 109 are formed between the diodes 103 and between heavily doped regions 110 and 112. In some embodiments, the isolation structures are shallow trench isolation (STI) structures. The fabrication process of the diode string voltage adapter 100 can use any suitable conventional methods and/or materials known in the art.

In some embodiments, the first conductive type is a P-doped type and the second conductive type is an N-doped type, thus the substrate 102 is a P-doped substrate, the deep well region 104 is a deep N-well, the first well region 108 is a P-well, the second well region 106 is an N-well, the first heavily doped region 112 is a P+ doped region, and the second heavily doped region 110 is an N+ doped region.

The diodes 103 are serially coupled to each other having a beginning diode and an ending diode, the first heavily doped region 112 of the beginning diode is coupled to a first voltage V1. The second heavily doped region 110 of each diode 103 is electrically coupled to the first heavily doped region 112 of the next diode 103. The second heavily doped region 110 of the ending diode provides a second voltage V2. The deep well region 104 of each diode 103 is electrically floating (e.g., by not coupling to a voltage).

In the example where the first conductive type is a P-doped type and the second conductive type is an N-doped type, V1 is higher than V2. A parasitic transistor 114 in each diode 103 may result from the P-well 108, the deep N-well 104, and P-doped substrate 102. Because the deep N-well 104 is floating (as well as N-well 106), the parasitic transistor 114 is not turned on and its leakage current is prevented. V1 is higher than V2 by a value approximately equal to the number of diodes 103 times the turn-on voltage Vt of each diode 103. In some embodiments, Vt is about 0.7 V-1.2 V depending on materials, doping concentration, etc. In one example, the diode string voltage adapter 100 has three diodes 103 with Vt=1.2 V each, and when Vin=18.6 V, Vout is 15 V, thus providing a voltage drop of about 3.6 V. The leakage current is less than 50 pA.

The diode string voltage adapter 100 is used for high voltage circuit, e.g. 10 V-20 V in some embodiments. Each diode 103 has separate second well region 106 and deep well region 104 that are electrically floating and surrounding the first well region 108 to reduce leakage current. Because the second well region 106 and deep well region 104 are electrically floating, there is no need to form heavily doped regions and pads for the second well region 106 and deep well region 104. Also, there is no need to connect the second well region 106 and deep well region 104 to a voltage.

Figure 2:
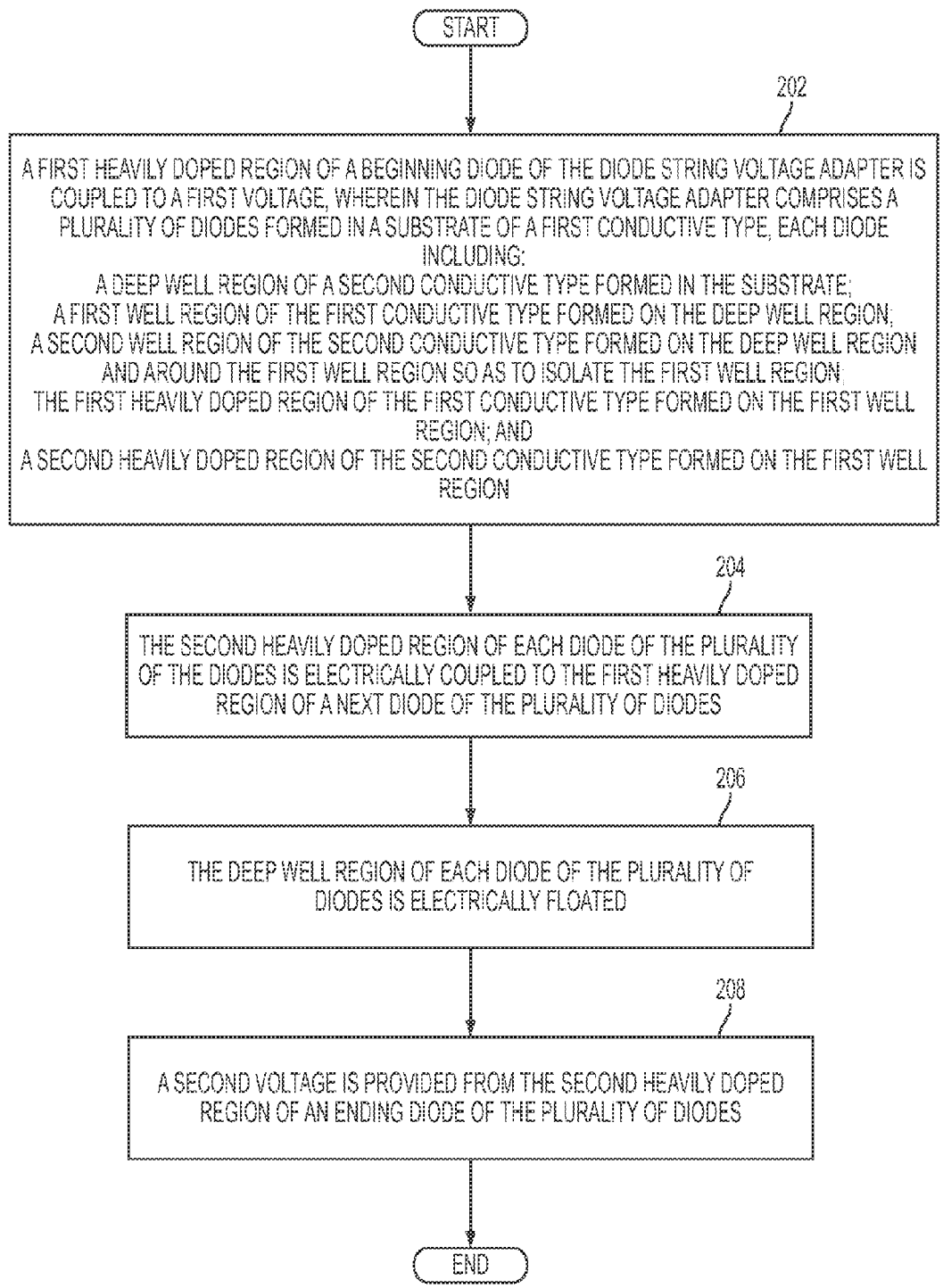
FIG. 2 is a flowchart of a method of operating the diode string voltage adapter in FIG. 1 according to some embodiments.

FIG. 2 is a flowchart of a method of operating the diode string voltage adapter in FIG. 1 according to some embodiments. At step 202, a first heavily doped region of a beginning diode of the diode string voltage adapter is coupled to a first voltage. The diode string voltage adapter comprises a plurality of diodes formed in a substrate of a first conductive type. Each diode includes a deep well region of a second conductive type formed in the substrate; a first well region of the first conductive type formed on the deep well region; a second well region of the second conductive type formed on the deep well region and around the first well region so as to isolate the first well region; the first heavily doped region of the first conductive type formed on the first well region; and a second heavily doped region of the second conductive type formed on the first well region.

At step 204, the second heavily doped region of each diode of the plurality of the diodes is electrically coupled to the first heavily doped region of a next diode of the plurality of diodes. At step 206, the deep well region of each diode of the plurality of diodes is electrically floated. At step 208, a second voltage is provided from the second heavily doped region of an ending diode of the plurality of diodes.

In various embodiments, the second well region is electrically floated. The first conductive type is a p-doped type, the second conductive type is an n-doped type, and the first voltage is higher than the second voltage. The first voltage is higher than the second voltage by a value approximately equal to the number of diodes times a turn-on voltage of each diode.

According to some embodiments, a diode string voltage adapter includes diodes formed on a substrate of a first conductive type. Each diode includes a deep well region of a second conductive type formed on the substrate. A first well region of the first conductive type formed on the deep well region. A first heavily doped region of the first conductive type formed on the first well region. A second heavily doped region of the second conductive type formed on the first well region. The diodes are serially coupled to each other having a beginning diode and an ending diode. The first heavily doped region of the beginning diode is coupled to a first voltage. The second heavily doped region of each diode is electrically coupled to the first heavily doped region of a next diode. The second heavily doped region of the ending diode provides a second voltage. The deep well region floats.

According to some embodiments, a method of operating a diode string voltage adapter includes coupling a first heavily doped region of a beginning diode of the diode string voltage adapter to a first voltage. The diode string voltage adapter comprises a plurality of diodes formed in a substrate of a first conductive type. Each diode includes a deep well region of a second conductive type formed in the substrate; a first well region of the first conductive type formed on the deep well region; a second well region of the second conductive type formed on the deep well region and around the first well region so as to isolate the first well region; the first heavily doped region of the first conductive type formed on the first well region; and a second heavily doped region of the second conductive type formed on the first well region. The second heavily doped region of each diode of the plurality of the diodes is electrically coupled to the first heavily doped region of a next diode of the plurality of diodes. The deep well region of each diode of the plurality of diodes is configured to be electrically floated. A second voltage is provided from the second heavily doped region of an ending diode of the plurality of diodes.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A diode string voltage adapter, comprising:
a substrate of a first conductive type; and
a plurality of diodes formed in the substrate, each diode including:
 a deep well region of a second conductive type formed in the substrate;
 a first well region of the first conductive type formed on the deep well region;
 a first heavily doped region of the first conductive type formed on the first well region;
 a second heavily doped region of the second conductive type formed on the first well region; and
 a third heavily doped region of the second conductive type formed on the first well region, the third heavily doped region being physically separated from the second heavily doped region and the first heavily doped region, wherein a top surface of the third heavily doped region is substantially co-planar with a top surface of the first well region,
wherein the plurality of diodes are serially coupled to each other having a beginning diode and an ending diode, the first heavily doped region of the beginning diode of the plurality of diodes is configured to be coupled to a first voltage, the second heavily doped region of each diode of the plurality of the diodes is configured to be electrically coupled to the first heavily doped region of a next diode of the plurality of diodes, the second heavily doped region of the ending diode of the plurality of diodes is configured to provide a second voltage, and the deep well region of each diode is configured to be electrically floated, during operation of the diode string voltage adapter.

2. The diode string voltage adapter of claim 1, wherein each diode further comprises a second well region of the second conductive type formed on the deep well region and around the first well region so as to isolate the first well region, and the second well region is configured to be electrically floated.

3. The diode string voltage adapter of claim 1, wherein the third heavily doped region is configured to be electrically coupled to the second heavily doped region.

4. The diode string voltage adapter of claim 1, wherein the first conductive type is a P-type, the second conductive type is an N-type, and the first voltage is higher than the second voltage.

5. The diode string voltage adapter of claim 4, wherein the first voltage is higher than the second voltage by a value approximately equal to a number of the plurality of diodes times a turn-on voltage of each diode, and each diode has the same turn-on voltage.

6. The diode string voltage adapter of claim 1, further comprising isolation structures formed between the plurality of diodes.

7. The diode string voltage adapter of claim 6, wherein the isolation structures are shallow trench isolation structures.

8. The diode string voltage adapter of claim 1, wherein each diode further comprises at least one isolation structure formed between the first heavily doped region and the second heavily doped region.

9. The diode string voltage adapter of claim 8, wherein the at least one isolation structure is a shallow trench isolation structure.

10. A method of operating a diode string voltage adapter, comprising:
coupling a first heavily doped region of a beginning diode of the diode string voltage adapter to a first voltage, wherein the diode string voltage adapter comprises a plurality of diodes formed in a substrate of a first conductive type, each diode including:
a deep well region of a second conductive type formed in the substrate;
a first well region of the first conductive type formed on the deep well region;
a second well region of the second conductive type formed on the deep well region and around the first well region so as to isolate the first well region;
the first heavily doped region of the first conductive type formed on the first well region;
a second heavily doped region of the second conductive type formed on the first well region; and
a third heavily doped region of the second conductive type formed on the first well region, the third heavily doped region being physically separated from the second heavily doped region and the first heavily doped region, wherein a top surface of the third heavily doped region is substantially co-planar with a top surface of the first well region;
electrically coupling the second heavily doped region of each diode of the plurality of the diodes to the first heavily doped region of a next diode of the plurality of diodes;
electrically floating the deep well region of each diode of the plurality of diodes; and
providing a second voltage from the second heavily doped region of an ending diode of the plurality of diodes.

11. The method of claim 10, further comprising electrically floating the second well region.

12. The method of claim 10, wherein the first conductive type is a P-doped type, the second conductive type is an N-doped type, and the first voltage is higher than the second voltage.

13. The method of claim 10, wherein the first voltage is higher than the second voltage by a value approximately equal to a number of the plurality of diodes times a turn-on voltage of each diode.

14. A diode string voltage adapter, comprising:
a P-doped substrate; and
a plurality of diodes formed in the P-doped substrate, each diode including:
a deep N-well region formed in the P-doped substrate;
a P-well region formed on the deep N-well region;
an N-well region formed on the deep N-well region and around the P-well region so as to isolate the P-well region, and the N-well region is configured to be electrically floated;
a heavily doped P-type region formed on the P-well region;
a first heavily doped N-type region formed on the P-well region; and
a second heavily doped N-type region formed on the P-well region, the second heavily doped N-type region being physically separated from the first heavily doped N-type region and the heavily doped P-type region, wherein a top surface of the second heavily doped N-type region is substantially co-planar with a top surface of the P-well region,
wherein the plurality of diodes are serially coupled to each other having a beginning diode and an ending diode, the heavily doped P-type region of the beginning diode of the plurality of diodes is configured to be coupled to a first voltage, the first heavily doped N-type region of each diode of the plurality of the diodes is configured to be coupled to the heavily doped P-type region of a next diode of the plurality of diodes, the first heavily doped N-type region of the ending diode of the plurality of diodes is configured to provide a second voltage, the deep N-well region of each diode is configured to be electrically floated, and the first voltage is higher than the second voltage.

15. The diode string voltage adapter of claim 14, wherein the second heavily doped N-type region is coupled to the first heavily doped N-type region.

16. The diode string voltage adapter of claim 14, wherein the first voltage is higher than the second voltage by a value approximately equal to a number of the plurality of diodes times a turn-on voltage of each diode, and each diode has the same turn-on voltage.

17. The diode string voltage adapter of claim 14, further comprising isolation structures formed between the plurality of diodes.

18. The diode string voltage adapter of claim 17, wherein the isolation structures are shallow trench isolation structures.

19. The diode string voltage adapter of claim 14, wherein each diode further comprises at least one isolation structure formed between the first heavily doped N-type region and the heavily doped P-type region.

20. The diode string voltage adapter of claim 19, wherein the at least one isolation structure is a shallow trench isolation structure.

* * * * *